US012581890B2

(12) United States Patent
Guo et al.

(10) Patent No.: US 12,581,890 B2
(45) Date of Patent: Mar. 17, 2026

(54) SILICON WAFER, PREPARATION METHOD OF SILICON WAFER, AND PASSIVATION TREATMENT SOLUTION

(71) Applicants: JINKO SOLAR CO., LTD., Jiangxi (CN); Zhejiang Jinko Solar Co., Ltd., Haining (CN)

(72) Inventors: Jiangtao Guo, Haining (CN); Yongbing Xu, Haining (CN); Liang Liu, Haining (CN); Xinyang Chen, Haining (CN)

(73) Assignees: Jink Solar Co., Ltd., Jiangxi (CN); Zhejiang Jinko Solar Co., Ltd., Haining (CN)

( * ) Notice: Subject to any disclaimer, the term of this patent is extended or adjusted under 35 U.S.C. 154(b) by 600 days.

(21) Appl. No.: 17/884,455

(22) Filed: Aug. 9, 2022

(65) Prior Publication Data

US 2023/0420243 A1     Dec. 28, 2023

(30) Foreign Application Priority Data

Jun. 27, 2022     (CN) .......................... 202210745353.9

(51) Int. Cl.
*H10P 70/00*          (2026.01)
*C01B 33/02*          (2006.01)
*H10W 74/10*          (2026.01)

(52) U.S. Cl.
CPC .............. *H10P 70/15* (2026.01); *C01B 33/02* (2013.01); *H10W 74/137* (2026.01)

(58) Field of Classification Search
CPC .......... H01L 21/02052; H01L 23/3171; C01B 33/02; H10F 71/121; H10F 71/129;
(Continued)

(56) References Cited

U.S. PATENT DOCUMENTS 6,340,640 B1 *  1/2002  Nishimoto ............ H10F 71/121
                                                                    257/E31.13
8,048,767 B2 *  11/2011  Morimoto ............. H01L 21/187
                                                                    438/455
(Continued)

FOREIGN PATENT DOCUMENTS

CN          101024882 B          5/2010
CN          101817006 A          9/2010
(Continued)

OTHER PUBLICATIONS

CN-107039241-A, Machine Translation (Year: 2025).*
(Continued)

*Primary Examiner* — Binh X Tran
*Assistant Examiner* — Christopher Remavege
(74) *Attorney, Agent, or Firm* — Knobbe, Martens, Olson & Bear, LLP

(57)          ABSTRACT

A silicon wafer, a preparation method of the silicon wafer, and a passivation treatment solution is disclosed. The preparation method of the silicon wafer can include the following steps: providing a solar silicon ingot; cutting the solar silicon ingot with a first treatment solution to form a pretreated
(Continued)

Providing a solar silicon rod — Step 100

Cutting the solar silicon rod with a first treatment solution to form a pretreated silicon wafer — Step 200

Degluing the pretreated silicon wafer with a second treatment solution to obtain a deglued silicon wafer — Step 300

Cleaning the deglued silicon wafer with a third treatment solution to obtain the silicon wafer — Step 400 silicon wafer; degluing the pretreated silicon wafer with a second treatment solution to obtain a deglued silicon wafer; and cleaning the deglued silicon wafer with a third treatment solution to obtain the silicon wafer; wherein at least one of the first treatment solution, the second treatment solution and the third treatment solution comprises a non-metallic compound that is bonded with a silicon ion via a single bond.

13 Claims, 2 Drawing Sheets

(58) Field of Classification Search
CPC ..... H10F 77/311; Y02P 70/50; C10M 125/18; C10M 125/20; C11D 7/10; C11D 7/3209; C11D 2111/22
See application file for complete search history.

(56) References Cited

U.S. PATENT DOCUMENTS

| | | | | |
|---|---|---|---|---|
| 2010/0197144 A1* | 8/2010 | Dove | .................... | H10F 77/703 |
| | | | | 438/753 |
| 2010/0288330 A1* | 11/2010 | Riva | ..................... | H10D 86/60 |
| | | | | 216/24 |
| 2012/0083131 A1* | 4/2012 | An | ...................... | H01L 21/6708 |
| | | | | 438/734 |
| 2014/0256078 A1* | 9/2014 | Jin | ........................ | H10F 77/707 |
| | | | | 438/57 |
| 2019/0067496 A1* | 2/2019 | Guan | ................... | H10H 20/814 |

FOREIGN PATENT DOCUMENTS

| | | | | | |
|---|---|---|---|---|---|
| CN | 101717937 | B | 2/2012 | | |
| CN | 102698983 | A | 10/2012 | | |
| CN | 102800758 | A | 11/2012 | | |
| CN | 107039241 | A * | 8/2017 | ............. | B28D 5/045 |
| CN | 107104037 | A * | 8/2017 | ........ | H01L 21/31111 |
| CN | 107845702 | A | 3/2018 | | |
| CN | 113206172 | A | 8/2021 | | |
| WO | WO-2013128653 | A1 * | 9/2013 | ......... | B24B 27/0633 |

OTHER PUBLICATIONS

WO-2013128653-A1, Machine Translation. (Year: 2025).*
CN-107104037-A, Machine Translation. (Year: 2025).*
Notice of Allowance received in Chinese Application No. 202210745353 dated May 10, 2023 in 5 pp.
European Search Report received in Application No. 22188748 dated Jun. 6, 2023 in 6 pp.
Patent search report; Date of Mailing: May 27, 2022(6 pages).

* cited by examiner

SILICON WAFER, PREPARATION METHOD OF SILICON WAFER, AND PASSIVATION TREATMENT SOLUTION

CROSS REFERENCE

This application claims priority to Chinese Patent Application No. 202210745353.9, filed on Jun. 27, 2022, which is incorporated herein by reference in its entirety.

TECHNICAL FIELD

The present disclosure relates to the field of optical lens, and more particularly, to a camera optical lens suitable for handheld terminal devices such as smart phones or digital cameras and camera devices such as monitors or PC lenses.

BACKGROUND

A solar cell is an optoelectronic semiconductor wafer that uses sunlight to generate electricity directly, and also known as "solar chip" or "photovoltaic cell". As long as the solar cell is illuminated with certain illumination conditions, it can instantly output voltage and generate current in the presence of a loop. The mainstream of solar cells is crystalline silicon solar cells that work with photovoltaic effect. They use silicon wafers as carriers of solar cells. The quality of the silicon wafers directly determines the conversion efficiency of solar cells. However, the conversion efficiency of existing solar cells fabricated from silicon wafers is limited.

Therefore, it is desired to study a silicon wafer that can ensure a higher conversion efficiency of solar cells.

SUMMARY

In view of this, the present application relates to a silicon wafer, a preparation method of the silicon wafer, and a passivation treatment solution, which can improve the texturing uniformity of the silicon wafer and further improve the conversion efficiency of a solar cell using the silicon wafer.

In a first aspect, the present application provides a preparation method of a silicon wafer, including the following steps: providing a solar silicon ingot; cutting the solar silicon ingot with a first treatment solution to form a pretreated silicon wafer; degluing the pretreated silicon wafer with a second treatment solution to obtain a deglued silicon wafer; and cleaning the deglued silicon wafer with a third treatment solution to obtain the silicon wafer; and at least one of the first treatment solution, the second treatment solution and the third treatment solution includes a non-metallic compound that is bonded with a silicon ion via a single bond.

In some embodiment, the non-metallic compound that is bonded with a silicon ion via a single bond includes at least one of a fluorine-containing compound, an iodine-containing compound, a hydrogen-containing compound, a bromine-containing compound, and a cyano-containing compound.

In some embodiment the fluorine-containing compound includes at least one of potassium fluoride, sodium fluoride, hydrogen fluoride, lithium fluoride, tetramethylammonium fluoride, tetraethylammonium fluoride, and ammonium fluoride.

In some embodiment the iodine-containing compound includes at least one of potassium iodide, sodium iodide, tetramethylammonium iodide, tetraethylammonium iodide, ammonium iodide and p-iodophenol.

In some embodiment a mass ratio of the non-metallic compound that is bonded with a silicon ion via a single bond in at least one of the first treatment solution, the second treatment solution and the third treatment solution is less than or equal to 10%.

In some embodiment the conductivity of the first treatment solution is greater than 20 μs/cm.

In a second aspect, an embodiment of the present application provides a silicon wafer, including: a silicon substrate, at least part of a surface of the silicon substrate being provided with a passivation layer, the passivation layer including $SiX_y$, where X is at least one of F, Br, I, H and CN.

In some embodiment a thickness of the passivation layer ranges from 0.1 nm to 8 nm.

In a third aspect, an embodiment of the present application provides a passivation treatment solution, including a non-metallic compound that is bonded with a silicon ion via a single bond, and the passivation treatment solution is used in at least one of cutting treatment, degluing treatment and cleaning treatment of a silicon wafer.

In some embodiment a mass ratio of the non-metallic compound that is bonded with a silicon ion via a single bond in the passivation treatment solution is less than or equal to 10% and greater than 0.

In some embodiment the non-metallic compound that is bonded with a silicon ion via a single bond includes at least one of a fluorine-containing compound, an iodine-containing compound, a hydrogen-containing compound, a bromine-containing compound, and a cyano-containing compound.

BRIEF DESCRIPTION OF DRAWINGS

In order to more clearly illustrate the technical solutions in the embodiments of the present application or in the prior art, drawings to be used for description of embodiments and the prior art will be introduced briefly hereinafter. Obviously, drawings referred to in the following description are merely some embodiments of the present specification, and those skilled in the art may also conclude other drawings based on these drawings without paying creative labor.

Figure 1:
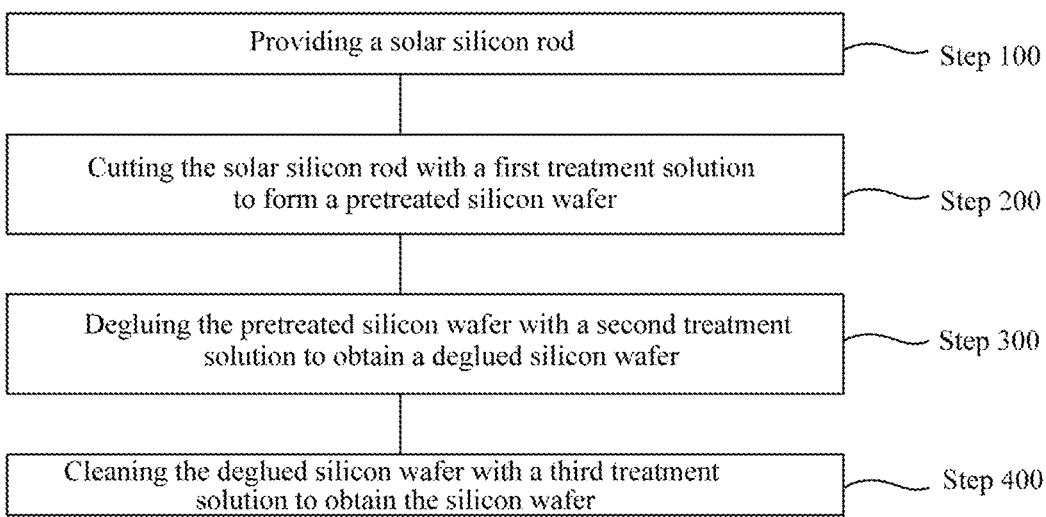
FIG. 1 is a preparation flow chart of a silicon wafer according to the present application.

In the figures,

1—silicon wafer;

2—dangling bond;

3—oxygen ion;

4—metal ion;

5—non-metallic ion that is bonded with a silicon ion via a single bond;

100—substrate;

200—passivation layer.

DETAILED DESCRIPTION

In order to better understand the technical solutions of the present application, the embodiments of the present application are described in detail below with reference to the accompanying drawings.

It should be clear that the described embodiments are only a part, but not all of the embodiments of the present application. All other embodiments obtained by a person of ordinary skill in the art based on the embodiments of the present disclosure without creative efforts shall fall within the protection scope of the present disclosure.

The terms used in the embodiments of the present application are only for the purpose of describing specific embodiments, and are not intended to limit the present application. The singular forms "a", "said" and "the" as used in embodiments of the present disclosure and the appended claims are also intended to include plural forms unless otherwise other meanings are explicitly indicated in the context.

It should be understood that the term "and/or" used in this document is only an association relationship to describe associated objects, indicating that there may be three kinds of relationships. For example, A and/or B may indicate three cases: A exists alone; A and B exist simultaneously; and B exists alone. In addition, the character "/" in this document generally indicates that the associated objects are in an "or" relationship.

The silicon wafer is prepared by silicon ingot cutting, and then degluing and cleaning. In the process of silicon ingot cutting, with the continuous improvement of silicon ingot cutting technology and the increase in the cost of silicon material, the silicon ingot cutting method has been updated from sand wire cutting to diamond wire cutting, so that the thickness of the silicon wafer can be drastically reduced. However, in the process of cutting a silicon ingot with diamond wire, the surface of the silicon wafer will be mechanically damaged, and the thickness of the damage takes a large proportion of the silicon wafer, which affects the performance and conversion efficiency of a solar cell prepared from the silicon wafer.

In order to further reduce the mechanical damage caused by the silicon ingot cutting to the silicon wafer, researchers carried out passivation treatment on the surface of the silicon wafer after cutting. However, the passivation treatment of the silicon wafer requires professional equipment, which increases the process flow of solar cells and causes the increase of production costs. Moreover, the existing passivation process makes it impossible for silicon wafers to be stored in the air for a long time after passivation, which significantly attenuates the effect of passivation. Therefore, it is desired to research and develop passivation processes and agents that are more suitable for large-scale production applications to reduce the occurrence of surface conformance to a certain extent.

Therefore, the present application provides a method for preparing a silicon wafer, where a treatment solution can be added in at least one of the cutting, degluing and cleaning processes, so as to be adsorbed and diffused to a damage generation area of the silicon wafer to form a passivation layer. In this way, the adsorption residues of metal ions and silicates on the surface of the silicon wafer and the formation of an oxide layer can be effectively reduced, which is beneficial to obtaining a cleaner and uniform textured surface during back-end cell texturing, thereby improving the performance and efficiency of the silicon wafer as a cell.

As shown in FIG. 1, it is a flow chart of a method for preparing a silicon wafer according to the present application, and the specific preparation method includes the following steps:

providing a solar silicon ingot;

cutting the solar silicon ingot with a first treatment solution to form a pretreated silicon wafer;

degluing the pretreated silicon wafer with a second treatment solution to obtain a deglued silicon wafer; and cleaning the deglued silicon wafer with a third treatment solution to obtain the silicon wafer;

and at least one of the first treatment solution, the second treatment solution and the third treatment solution includes a non-metallic compound that is bonded with a silicon ion via a single bond.

In the above solution, according to the present application, since the non-metallic compound that is bonded with a silicon ion via a single bond is added in at least one of the cutting treatment, degluing treatment and cleaning treatment of the solar silicon ingot, Si dangling bonds on the surface of the silicon wafer are covalently bonded to the non-metallic compound, the dangling bonds on the surface of the prepared silicon wafer are basically eliminated, the interface activity is greatly reduced, and the bridging effect between silicon and oxygen can be effectively reduced. In this way, the residues of impurities such as metal ions and silicates on the surface of the silicon wafer can be blocked and the adsorption residues of metal ions and silicates on the surface of the silicon wafer and the formation of an oxide layer can be reduced, which is beneficial to the cleanliness and uniformity of texturing during preparation of a cell using the silicon wafer. Therefore, after the texturing, the silicon wafer has higher minority carrier lifetime, specific surface area and fill factor and the conversion efficiency of the solar cell prepared from the silicon wafer is improved. The preparation method of the present application is simple and needs additional steps, which can effectively reduce costs and improve cell efficiency.

In the silicon wafer prepared according to the present application, the surface of the silicon wafer is covered with non-metallic ions and forms a covalent compound, showing a certain degree of hydrophobicity, which can effectively reduce the adhesion of the metal ions on the surface of the silicon wafer.

Figure 2:
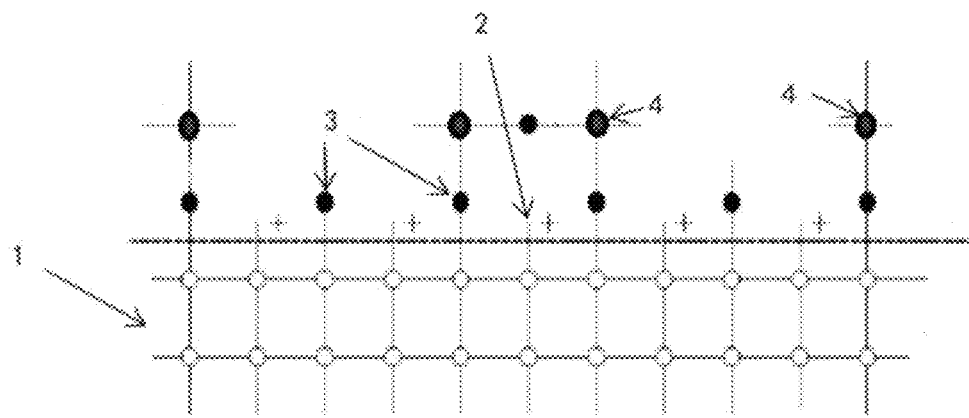
FIG. 2 is a microscopic schematic diagram of a surface of an existing silicon wafer.

It is understandable that after the silicon ingot is cut, the complete lattice of the silicon crystal surface is destroyed, exposing a large number of dangling bonds. Unstabilized broken Si bonds show extremely strong chemical activity, which will interact with OH—, dissolved oxygen, and the like in the solutions of cutting, degluing and cleaning treatment to form Si—OH, Si—O— and other bonds. Since oxygen usually exists in the form of negative divalent ions, after oxygen ions are linked to Si, the other end of oxygen can be linked to a metal ion to form Si—O-M, where M can be a heavy metal ion, such as Fe, Cr, Ni, Cu, Mn, Zn, and the like and can also be a residual metal ion of silicates, such as Na, K, and the like. As shown in FIG. 2, it shows a microscopic schematic diagram of the surface of the silicon wafer without passivation treatment, the dangling bonds 2 after cutting are easily linked to the oxygen ions 3 and metal ions 4 on the surface of the silicon wafer 1. Therefore, according to the present application, by adding the non-metallic compound that is bonded with a silicon ion via a single bond in the treatment process of the silicon wafer, the silicon dangling bonds can be preferentially linked to the non-metallic compound that is bonded with a silicon ion via a single bond, thereby reducing the bridging effect of the Si—O bond and further reducing the residues of metal ions and silicates on the surface of the silicon wafer.

In some embodiments, the non-metallic compound that is bonded with a silicon ion via a single bond includes at least one of a fluorine-containing compound, an iodine-containing compound, a hydrogen-containing compound, a bromine-containing compound, and a cyano-containing compound.

In some embodiments, the fluorine-containing compound includes an inorganic fluoride salt, including at least one of potassium fluoride, sodium fluoride, hydrogen fluoride, lithium fluoride, tetramethylammonium fluoride, tetraethylammonium fluoride, and ammonium fluoride.

In some embodiments, the iodine-containing compound includes at least one of potassium iodide, sodium iodide, tetramethylammonium iodide, tetraethylammonium iodide, ammonium iodide and p-iodophenol.

In some embodiments, the bromine-containing compound includes at least one of hydrogen bromide, potassium bromide, sodium bromide, lithium bromide, and ammonium bromide.

In some embodiments, the cyano-containing compound includes at least one of potassium cyanide, sodium cyanide, and ammonium cyanide.

Preferably, in order to reduce cost, achieve mass production, and improve production safety, the non-metallic compound that is bonded with a silicon ion via a single bond includes at least one of a fluorine-containing compound and an iodine-containing compound. In the actual production process, only a single-bond compound that is more stable relative to the Si—O bond can be formed with silicon to ensure that the silicon wafer still has a protective effect during subsequent contact with water and air. The compound with a smaller ionic radius and a greater bond energy can be selected to highly ensure the formation of a stable compound on the surface of the silicon wafer. Most of the compounds formed by cyanide ions are toxic and their reactions are not easy to control, so they are used less frequently. In addition, after the solar silicon ingot is cut into a silicon wafer, a damaged layer on the surface of the silicon wafer has a certain thickness. Not only are there dangling bonds on the top surface of the silicon wafer, but in the near-surface region of the silicon wafer, the integrity of the silicon lattice is also destroyed, resulting in distortion and microscopic cracks. These regions also have broken Si bonds. Therefore, the smaller the ionic radius of the compound, the smaller the steric hindrance, the easier it can be diffused into the near-surface area of the silicon wafer, and the more stable the compound formed. Preferably, the non-metallic compound single-bonded with the silicon ion includes a fluorine-containing compound. Preferably, the non-metallic compound that is single-bonded with the silicon ion includes a fluorine-containing compound.

It can be understood that the non-metallic compound that is bonded with a silicon ion via a single bond reacts with the surface of the silicon wafer and forms a layered structure, i.e., the passivation layer, on the surface of the silicon wafer. The existence of the passivation layer greatly reduces the residues of dangling bonds, metal ions and silicates on the surface of the silicon wafer and enhances the surface uniformity of the silicon wafer, which is beneficial to obtaining a more uniform and clean textured surface during the subsequent texturing.

In some embodiments, the mass ratio of the non-metallic compound that is bonded with a silicon ion via a single bond in at least one of the first treatment solution, the second treatment solution and the third treatment solution is less than or equal to 10%, specifically 0.05%, 0.1%, 0.5%, 0.8%, 1%, 1.5%, 2%, 3%, 4%, 5%, 6%, 7%, 8%, 9%, 10%, and the like. Controlling the mass ratio of the non-metallic compound that is bonded with a silicon ion via a single bond within the above range can ensure the normal cutting, degluing and cleaning of the solar silicon ingot and also can facilitate the combination of the silicon dangling bonds and the non-metallic compound that is bonded with a silicon ion via a single bond. Preferably, the mass ratio of the non-metallic compound that is bonded with a silicon ion via a single bond in at least one of the first treatment solution, the second treatment solution and the third treatment solution is less than or equal to 2%.

In some embodiments, the conductivity of the first treatment solution is greater than 20 μs/cm. For example, the conductivity of the first treatment solution may be 21 μs/cm, 23 μs/cm, 25 μs/cm, 26 μs/cm, 28 μs/cm, 30 μs/cm, 35 μs/cm, 38 μs/cm, and the like. Since the non-metallic compound that is bonded with a silicon ion via a single bond is a salt substance, its addition to the first treatment solution will increase the conductivity of the solution and further improve the conductivity of the solution. When the conductivity of the first treatment solution is less than or equal to 20 μs/cm, the dose of the non-metallic compound that is bonded with a silicon ion via a single bond is too small to react the dangling bonds on the surface of the silicon wafer. Moreover, after the solar silicon ingot is cut, there will be a certain amount of silicon powder in the environment. Due to the higher surface activity of the silicon powder, the non-metallic compound that is bonded with a silicon ion via a single bond will preferentially react with the silicon powder, but not with the surface of silicon wafer. Therefore, according to the present application, the purpose of limiting the conductivity of the first treatment solution to be greater than 20 μs/cm is to ensure complete reaction with the dangling bonds on the surface of the silicon wafer, to ensure the formation of the passivation layer, and to further ensure the passivation effect.

In some embodiments, according to the present disclosure, the non-metallic compound that is bonded with a silicon ion via a single bond can be added only in any one of the cutting process, the degluing process and the cleaning process, and can also be added in any combination of the above two processes. Certainly, the non-metallic compound that is bonded with a silicon ion via a single bond can also be added in all of the above three treatment processes, which is not limited in the present application.

In the following, taking the addition of the non-metallic compound that is bonded with a silicon ion via a single bond in the cutting process, the degluing process and the cleaning process as an example, the preparation method of the silicon wafer of the present application will be clearly and completely described with reference to the accompanying drawings in the embodiments of the present disclosure, and the described embodiments are only a part of the embodiments of the present disclosure, but not all of the embodiments.

In step S100, a solar silicon ingot is provided.

In some embodiments, the solar silicon ingot of the present application may be prepared by using a wafer, or may be a commercially available silicon ingot purchased directly.

In step S200, the solar silicon ingot is cut with a first treatment solution to form a pretreated silicon wafer.

The non-metallic compound that is bonded with a silicon ion via a single bond is added to the commercially available cutting solution for diamond wire cutting to form the first treatment solution. The dose of the non-metallic compound that is bonded with a silicon ion via a single bond varies according to stocks of cutting solutions sold by different producers. The conductivity of the first treatment solution is finally adjusted to be greater than 20 μs/cm, and then the solar silicon ingot is cut with the first treatment solution. Exemplarily, a commercially available cutting solution includes the following components in percentage by mass as shown in Table 1:

TABLE 1

| Formulations of the commercially available cutting solution | |
| --- | --- |
| Polyethylene glycol | 90% |
| Surfactant | Little |
| Chelating agent | 5%-7% |
| Organic alcohol | 2%-4% |
| Sodium molybdate | 0.11% to −0.36% |
| Sodium molybdate | 0.83%-3.64% |
| Deionized water | 0-15% |

Figure 3:
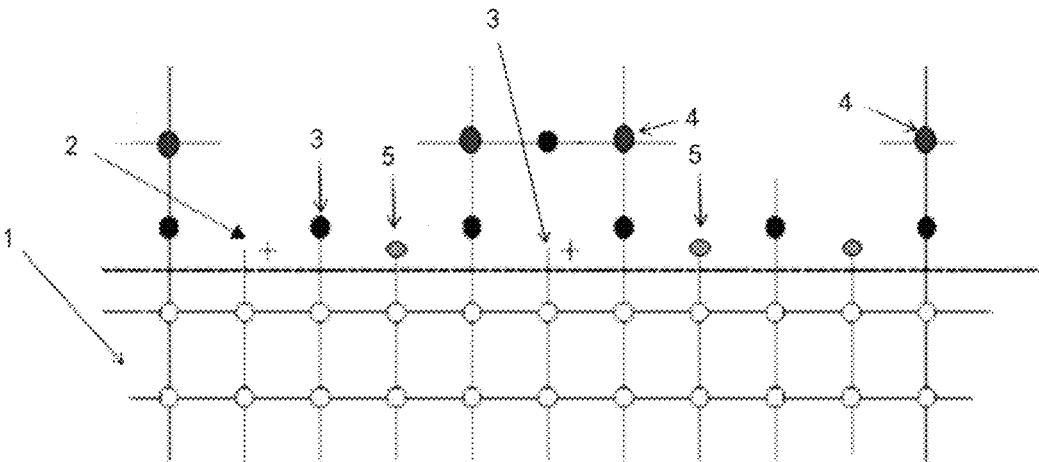
FIG. 3 is a schematic diagram of the principle of cutting a silicon ingot with a first treatment solution according to the present disclosure.

In the following, as shown in FIG. 3, the principle is explained by taking the addition of ammonium fluoride and potassium fluoride to the cutting solution comprising the components in Table 1 as an example.

Ammonium fluoride and potassium fluoride are added in the cutting solution of table 1, and the total mass of ammonium fluoride and potassium fluoride added to per kilogram of the cutting solution ranges from 5 g to 12 g. The mixed solution is then well mixed to obtain the first treatment solution. In this way, the conductivity of the first treatment solution is greater than 20 μs/cm and the fluoride ion content in the discharged wastewater does not exceed the national standard. During the cutting process, dangling bonds 2 are exposed on the surface of the silicon wafer 1. A part of the dangling bonds 2 can be linked with the oxygen ions 3 in the cutting solution to form Si—O bonds, and the other end of the oxygen ions 3 is easily linked with the metal ion 4. When F⁻ and I⁻ are added to the first treatment solution, there are at least F⁻, $Fe^{2+}$, I⁻ and other ions in the first treatment solution, and the corresponding standard electrode potentials are shown in Table 2 below. It can be seen that the F⁻ ion formed by the most oxidizing fluorine element has better stability and a smaller ionic radius, and can quickly diffuse and bond to the silicon dangling bonds 2 with a certain positive electricity to form passivation. Since the iodide ion has a large ionic radius, a large diffusion resistance, and a relatively weak attraction to the outermost electrons, the electron cloud is easily deformed and can attract other metal ions 4 in the cutting solution, so that the resistance of the metal ions 4 to the surface of the silicon wafer 1 is increased, thereby avoiding the formation of Si—O bridging bonds on the surface of the silicon wafer 1, and further reducing the residues of metal ions 4, silicates, and the like on the surface of the silicon wafer 1 and improving the passivation effect of the silicon wafer.

TABLE 2

| Standard potential parameters for ions in the first treatment solution | | |
| --- | --- | --- |
| Oxidability | Equation | Standard potential/V |
| F/F⁻ | $F_2 + 2e^- = 2F^-$ | +2.87 |
| $Fe^{3+}/Fe^{2+}$ | $Fe^{3+} + 2e^- = 2Fe^{2+}$ | +0.77 |

TABLE 2-continued

| Standard potential parameters for ions in the first treatment solution | | |
| --- | --- | --- |
| Oxidability | Equation | Standard potential/V |
| $Fe^{2+}/Fe$ | $Fe^{2+} + 2e^- = 2Fe$ | −0.45 |
| I/I⁻ | $I_2 + 2e^- = 2I^-$ | +0.54 |

In step 300, the pretreated silicon wafer is deglued with a second treatment solution to obtain a deglued silicon wafer.

In the cutting process of the silicon wafer, the silicon ingot and an silicon ingot support need to be fixed with glue to ensure that the silicon ingot does not move during the cutting process. Therefore, the silicon wafer needs to be deglued and cleaned after wire cutting to obtain a highly clean silicon wafer.

In some embodiments, the degluing treatment refers to placing the pretreated silicon wafers in a second treatment solution for degluing. The second treatment solution includes a degluing solution and a non-metallic compound that is bonded with a silicon ion via a single bond. The degluing solution is generally an acidic solution, which includes lactic acid and citric acid, and the like. Further, degluing treatment can be performed at a certain temperature. In this way, the time for softening the glue can be shortened, the damaged layer on the surface of the silicon wafer can also be polished roughly, and the silicon wafer can also be prevented from being oxidized at a high temperature.

Figure 4:
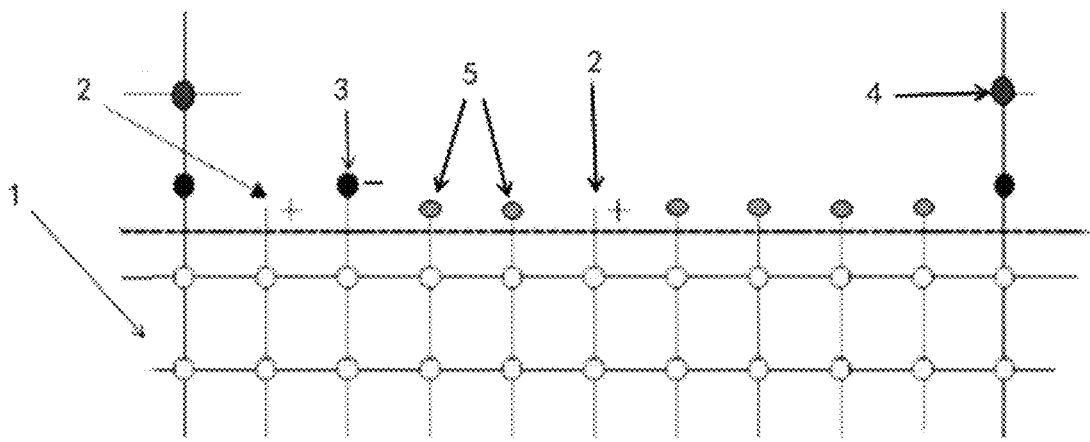
FIG. 4 is a schematic diagram of the principle of degluing the silicon wafer with a second treatment solution according to the present disclosure.

Hereinafter, as shown in FIG. 4, the principle will be explained by taking the addition of potassium fluoride to the lactic acid degluing solution as an example.

Potassium fluoride is added to the lactic acid degluing solution and the mixed solution is well stirred to obtain a second treatment solution. The mass ratio of potassium fluoride in the second treatment solution is less than or equal to 10% (and not 0), which can ensure that the fluoride ion content in the wastewater discharged from the degluing treatment does not exceed the national standard. The pretreated silicon wafer is placed in the second treatment solution, and the following chemical reaction equilibrium occurs: $SiF_4 + 3H_2O \leftrightarrows H_2SiO_3 + 4HF$. Under an acidic condition, the presence of F⁻ (non-metallic ions 5 that are bonded with a silicon ion via a single bond) allows the sites on the surface of the silicon wafer 1 that have been occupied by oxygen ions 3 and metal ions 4 to be replaced by F⁻ (non-metallic ions 5 that are bonded with a silicon ion via a single bond), so that the reaction proceeds to the left, and the F—Si single bond replaces the Si—O-bond containing an oxygen bridge, which reduces the probability of adsorption of metal ions by bridge oxygen, thereby improving the passivation effect.

In some embodiments, the step of removing impurities from the pretreated silicon wafer is further included prior to the degluing treatment. Specifically, physical methods, such as spray cleaning, ultrasonic cleaning, overflow cleaning, and the like, are used to remove impurities such as metal powder, silicon powder, silicon carbide, and cutting suspension attached to the surface of the pretreated silicon wafer.

In step 400, the deglued silicon wafer is cleaned with a third treatment solution to obtain the silicon wafer.

In some embodiments, the deglued silicon wafer is cleaned with a cleaning solution to further improve the cleanliness of the silicon wafer.

Figure 5:
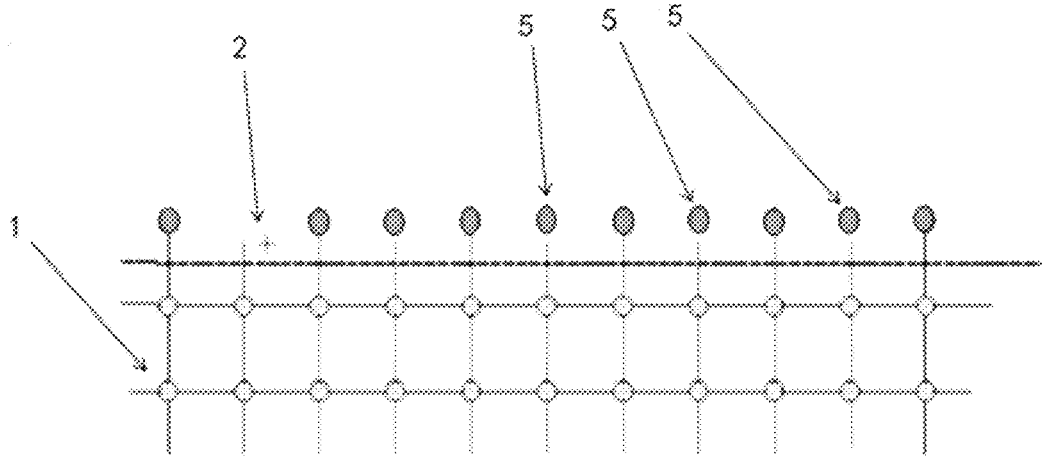
FIG. 5 is a schematic diagram of the principle of cleaning the silicon wafer with a third treatment solution according to the present disclosure.

Hereinafter, as shown in FIG. 5, the principle is explained by taking an example of adding ammonium fluoride to $H_2O/NH_4OH/H_2O_2$ as the cleaning solution.

Before cleaning of the deglued silicon wafer, ammonium fluoride with a mass ratio of not more than 0.5% is added to a $H_2O/NH_4OH/H_2O_2$ cleaning tank, and the mixed solution was then well stirred to obtain the third treatment solution, which can ensure that the fluoride ion content in the wastewater discharged from the cleaning process does not exceed the national standard. Usually, the silicon wafer 1 is cleaned usually in an alkaline heating environment. The strong alkali makes the fluorine-containing ammonium salt easy to decompose ammonia gas. In the meanwhile, the continuous heating environment can drive away part of the ammonia gas from the water body and the ammonia gas is discharged to the outdoors by an exhaust system of the equipment. In this case, the relatively excess fluoride ions in the solution will further react with the Si—OH or Si—O— bonds formed by the oxygen ions 3 on the surface of the silicon wafer 1 to form more stable Si—F bonds, so that the residues of the metal ions 4 and silicates are excluded from the surface, resulting in passivation protection.

In some embodiments, preferably, the non-metallic compound that is bonded with a silicon ion via a single bond is added at least in the cutting process. It can be understood that there are many Si dangling bonds in the silicon wafer formed after the solar silicon ingot cutting process. The solution added in this process includes the non-metallic compound that is bonded with a silicon ion via a single bond. In this way, a stable compound layer can be formed on the surface of the silicon wafer in advance, which is beneficial to avoid the subsequent degluing and cleaning processes.

To sum up, the present application combines the process characteristics of silicon wafer cutting treatment, degluing treatment and cleaning treatment. In addition, the dangling bonds are most active when the silicon wafer is cut, the result with $F^-$ ion is the most stable, and the electron cloud of $I^-$ ion trading polarization deformation is more likely to bind positively charged metal ions; therefore, the present disclosure achieves the stabilization of the dangling bonds on the surface of the silicon wafer and the obstruction of the diffusion of metal ions. By the acid solution and high processing temperature during the degluing process, the following chemical reaction equilibrium occurs: $SiF_4+3H_2O \leftrightarrows H_2SiO_3+4HF$ proceeds to the left, stripping off part of the formed surface silicate residues. By virtue of the decomposition effect of the alkaline solution with a high temperature and a high concentration on ammonium fluoride during silicon wafer cleaning, part of ammonia gas is volatilized to form a reaction environment with relatively excess fluoride ions in the cleaning solution. Finally, more F— ions replace the Si—O bonds on the surface of the silicon wafer to form F—Si single bonds. In this way, the bridging effect of divalent oxygen is reduced and the adhesion of metal ions and silicates on the surface of the silicon wafer is further reduced, which is beneficial to the formation of a uniform surface structure.

Figure 6:
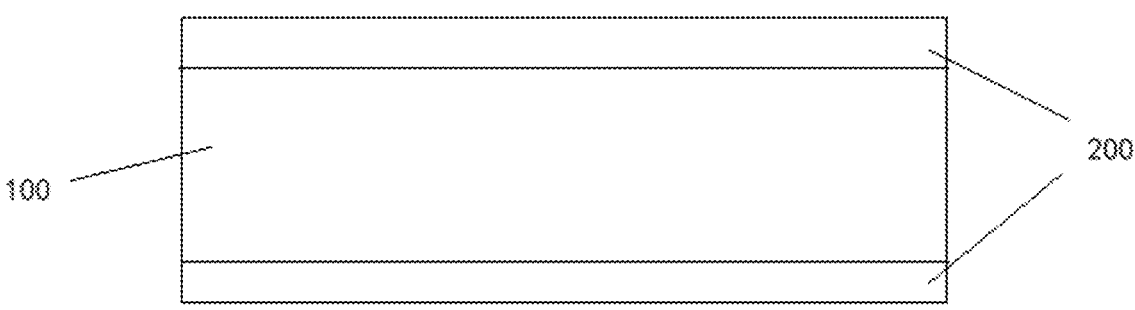
FIG. 6 is a schematic structural diagram of the silicon wafer according to the present application.

As shown in FIG. 6, the present application further provides a silicon wafer, including:

a silicon substrate 100, at least part of a surface of the silicon substrate being provided with a passivation layer 200, the passivation layer 200 including $SiX_y$, where X is at least one of F, Br, I, H and CN.

In the above solution, the surface of the silicon substrate 100 is the $SiX_y$ passivation layer 200, and the presence of the $SiX_y$ passivation layer can form a barrier on the surface of the silicon wafer to prevent impurities such as metal ions from reacting on the surface of the silicon wafer during the use of the silicon wafer, thereby improving the short-circuit current and parallel resistance of the solar cell prepared from the silicon wafer and improving the conversion efficiency of solar energy.

In some embodiments, the silicon substrate 100 may be an N-type substrate or a P-type substrate. The thickness of the silicon substrate 100 ranges from 110 μm to 250 μm. Specifically, the thickness of the silicon substrate 100 can be 110 μm, 120 μm, 140 μm, 150 μm, 160 μm, 170 μm, 180 μm, 180 μm, 190 μm, 200 μm, 210 μm, 220 μm, 230 μm, 240 μm, 250 μm, and the like. The thickness of the silicon substrate 100 is not limited in the embodiments of the present application.

In some embodiments, in the $SiX_y$ passivation layer 200, y satisfies the following relationship: $1 \leq y \leq 3$. It can be understood that the valence of Si is +4. After the solar silicon ingot is cut, the silicon atom on the surface of the silicon wafer is linked to at least one silicon atom inside the silicon wafer. Therefore, the silicon atom on the surface of the silicon wafer will have 1 to 3 Si dangling bonds, and the valence of X is −1. As a result, when $1 \leq y \leq 3$, it can satisfy that the reaction between X ions and the silicon wafer forms a stable passivation reactant.

In some embodiments, the thickness of the passivation layer 200 ranges from 0.1 nm to 8 nm, and specifically may be 0.1 nm, 0.5 nm, 1 nm, 2 nm, 3 nm, 4 nm, 5 nm, 6 nm, 7 nm, and 8 nm. By controlling the thickness of the passivation layer 200 within the above range, a stable passivation layer can be formed, and the passivation effect can be ensured. It can be understood that the passivation layer may be a part of the silicon wafer, and the passivation layer may also be a layered structure existing on the surface of the silicon wafer.

In some embodiments, the passivation layer 200 may be arranged on one surface of the silicon substrate 100, or on multiple surfaces of the silicon substrate 100. Preferably, the passivation layer 200 is arranged on the upper surface and lower surface of the silicon substrate 100.

The present application further provides a passivation treatment solution, including a non-metallic compound that is bonded with a silicon ion via a single bond, the passivation treatment solution being used in at least one of cutting treatment, degluing treatment and cleaning treatment of a silicon wafer.

In the above solution, the passivation treatment solution of the present application can passivate the silicon wafer in at least one of the cutting process, the degluing process and the cleaning process of the silicon wafer. In this way, the residues of dangling bonds, metal ions and silicates on the surface of the silicon wafer are greatly reduced and the uniformity of the surface of the silicon wafer is enhanced, which is beneficial to obtaining a more uniform and clean textured surface during the subsequent texturing of the silicon wafer.

In some embodiments, the mass ratio of the non-metallic compound that is bonded with a silicon ion via a single bond in the passivation treatment solution is less than or equal to 10% (and not 0), specifically 0.05%, 0.1%, 0.5%, 1%, 2%, 3%, 4%, 5%, 6%, 7%, 9%, and 10%.

In some embodiments, the non-metallic compound that is bonded with a silicon ion via a single bond includes at least one of a fluorine-containing compound, an iodine-containing compound, a hydrogen-containing compound, a bromine-containing compound, and a cyano-containing compound.

In some embodiments, the fluorine-containing compound includes an inorganic fluoride salt, including at least one of potassium fluoride, sodium fluoride, hydrogen fluoride, lithium fluoride, tetramethylammonium fluoride, tetraethylammonium fluoride, and ammonium fluoride.

In some embodiments, the iodine-containing compound includes at least one of potassium iodide, sodium iodide, tetramethylammonium iodide, tetraethylammonium iodide, ammonium iodide and p-iodophenol.

In some embodiments, the bromine-containing compound includes at least one of hydrogen bromide, potassium bromide, sodium bromide, lithium bromide, and ammonium bromide.

In some embodiments, the cyano-containing compound includes at least one of potassium cyanide, sodium cyanide, and ammonium cyanide.

In some embodiments, when the passivation treatment solution is used in at least one of the cutting treatment, the degluing treatment and the cleaning treatment, the passivation treatment solution should be prepared and used on site before use, it is not suggested to prepare the passivation treatment solution in advance and use it after long-term storage. The time interval between the preparation of the passivation treatment solution and the use of the passivation treatment solution should be controlled within 30 min.

Property Test

In the production process, a long silicon ingot with a length of 600 mm is cut into 4 equal short silicon ingots, which are 1 # silicon ingot, 2 # silicon ingot, 3 # silicon ingot, and 4 # silicon ingot.

In the following examples, the commercially available silicon wafer cleaning solution is $H_2O/NH_4OH/H_2O_2$, the commercially available silicon wafer degluing solution is lactic acid, and the formula of the commercially available cutting solution is shown in Table 1.

Comparative Example 1

The 1 # silicon ingot was cut with a commercially available silicon wafer cutting solution to form a pretreated silicon wafer.

The pretreated silicon wafer was deglued with a commercially available silicon wafer degluing solution to obtain a deglued silicon wafer.

The deglued silicon wafer was cleaned with a commercially available silicon wafer cleaning solution to obtain a silicon wafer.

Example 1

The 2 # silicon ingot was cut with a commercially available silicon wafer cutting solution to form a pretreated silicon wafer.

The pretreated silicon wafer was deglued with a commercially available silicon wafer degluing solution to obtain a deglued silicon wafer.

The deglued silicon wafer was cleaned with the third treatment solution to obtain a silicon wafer, wherein the third treatment solution included a mixed solution of a commercially available silicon wafer cleaning solution and ammonium fluoride, wherein the mass ratio of the ammonium fluoride in the third treatment solution was 0.5%.

Example 2

The 3 # silicon ingot was cut with a commercially available silicon wafer cutting solution to form a pretreated silicon wafer.

The pretreated silicon wafer was deglued with the second treatment solution to obtain a deglued silicon wafer, wherein the second treatment solution included a mixed solution of a commercially available silicon wafer degluing solution and potassium fluoride, and the mass ratio of potassium fluoride in the second treatment solution was 1%.

The deglued silicon wafer was cleaned with the third treatment solution to obtain a silicon wafer, wherein the third treatment solution included a mixed solution of a commercially available silicon wafer cleaning solution and ammonium fluoride, wherein the mass ratio of the ammonium fluoride in the third treatment solution was 0.5%.

Example 3

The 4 # silicon ingot was cut with the first treatment solution to form a pretreated silicon wafer. The first treatment solution included 1 kg of a commercially available silicon wafer cutting solution, 2.6 g of potassium fluoride and 7.34 g of potassium iodide. The conductivity of the first treatment solution was 20.3 μs/cm.

The pretreated silicon wafer was deglued with the second treatment solution to obtain a deglued silicon wafer, wherein the second treatment solution included a mixed solution of a commercially available silicon wafer degluing solution and potassium fluoride, and the mass ratio of potassium fluoride in the second treatment solution was 1%.

The deglued silicon wafer was cleaned with the third treatment solution to obtain a silicon wafer, wherein the third treatment solution included a commercially available silicon wafer cleaning solution and ammonium fluoride, wherein the mass ratio of the ammonium fluoride in the third treatment solution was 0.5%.

Finally, the texture parameters of each group of bare wafers after texturing were tested on the silicon wafers treated in the above four ways, and the results of solar cells (e.g., P-type cells) respectively prepared from the silicon wafers are shown in Table 3:

TABLE 3

| | Property parameters of examples and the Comparative Example | | | |
|---|---|---|---|---|
| Sample No. | Minority mean Us | Difference from the number of pyramids in Comparative Example 1 /mm$^2$ | Specific surface area % | Photoelectric conversion efficiency of the cell % |
| Comparative Example 1 | 0.944 | / | 1.406 | 23.24 |
| Example 1 | 0.945 | 10000-20000 | 1.417 | 23.26 |
| Example 2 | 0.950 | 40000-50000 | 1.467 | 23.27 |
| Example 3 | 0.955 | 55000-60000 | 1.486 | 23.28 |

According to the data in Table 3, it can be seen that after adding the corresponding passivation treatment solutions in different processes of silicon ingot cutting, degluing and cleaning, the minority carrier lifetime of the bare wafers increases in different proportions, and the pyramidal texture is more uniform, thereby effectively improving the conversion efficiency of the silicon wafers as solar cells.

The above description is merely preferred embodiments of the present disclosure and is not intended to limit the present application, and various changes and modifications of the present disclosure may be made by those skilled in the art. Any modifications, equivalents, improvements, etc.

made within the spirit and principle of the present disclosure are intended to be included within the scope of the present application.

Although the present application discloses the preferred embodiments as above, they are not provided to limit the claims. Any person skilled in the art can make some possible changes and modifications without departing from the concept of the present application. The scope of the present application shall be subject to the scope defined by the claims of the present application.

What is claimed is:

1. A method for preparing a silicon wafer, comprising:

providing a solar silicon ingot;

cutting the solar silicon ingot with a first treatment solution to form a pretreated silicon wafer;

degluing the pretreated silicon wafer with a second treatment solution to obtain a deglued silicon wafer; and cleaning the deglued silicon wafer with a third treatment solution to obtain the silicon wafer, wherein at least the second treatment solution and the third treatment solution comprises a non-metallic compound that is bonded with a silicon ion via a single bond, wherein the non-metallic compound comprises a fluorine-containing compound, and wherein the fluorine-containing compound comprises at least one of potassium fluoride, sodium fluoride, lithium fluoride, tetramethylammonium fluoride, or tetraethylammonium fluoride.

2. The method according to claim 1, wherein at least one of the first treatment solution, the second treatment solution, or the third treatment solution comprises the non-metallic compound with a mass ratio of less than or equal to 10%.

3. The method according to claim 2, wherein at least one of the first treatment solution, the second treatment solution, or the third treatment solution comprises the non-metallic compound with a mass ratio of less than or equal to 1%.

4. The method according to claim 2, wherein the first treatment solution has a conductivity of greater than 20 $\mu$s/cm.

5. The method according to claim 4, wherein the first treatment solution has a conductivity of greater than 30 $\mu$s/cm.

6. The method according to claim 1, further comprising removing impurities from the pretreated silicon wafer prior to degluing.

7. The method according to claim 1, wherein the non-metallic compound is added during cutting.

8. A silicon wafer prepared by the method according to claim 1, the silicon wafer, provided with a passivation layer over at least part of a surface of the silicon wafer, wherein the passivation layer comprises $SiX_y$ as a result of claim 1, where X is F.

9. The silicon wafer according to claim 8, wherein a thickness of the silicon wafer ranges from 110 $\mu$m to 250 $\mu$m.

10. The silicon wafer according to claim 8, wherein a thickness of the passivation layer ranges from 0.1 nm to 8 nm.

11. A passivation treatment solution, comprising a non-metallic compound that is bonded with a silicon ion via a single bond, wherein the passivation treatment solution is used in at least one of cutting treatment, degluing treatment, or cleaning treatment of the silicon wafer according to claim 8.

12. The passivation treatment solution according to claim 11, wherein the passivation treatment solution comprises the non-metallic compound with a mass ratio of less than or equal to 10% and greater than 0%.

13. The passivation treatment solution according to claim 11, wherein the non-metallic compound comprises a fluorine-containing compound.

* * * * *